United States Patent
Inagaki et al.

(10) Patent No.: US 6,737,586 B2
(45) Date of Patent: May 18, 2004

(54) FLAT CABLE AND A MANUFACTURING METHOD THEREFOR

(75) Inventors: Tomonori Inagaki, Yokkaichi (JP); Yoshiaki Yamano, Yokkaichi (JP); Koji Fukumoto, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 10/348,974

(22) Filed: Jan. 23, 2003

(65) Prior Publication Data

US 2003/0106706 A1 Jun. 12, 2003

Related U.S. Application Data

(62) Division of application No. 09/901,112, filed on Jul. 10, 2001, now Pat. No. 6,585,836.

(30) Foreign Application Priority Data

Jul. 11, 2000 (JP) ......................................... 2000-209759
Aug. 11, 2000 (JP) ......................................... 2000-244711

(51) Int. Cl.⁷ ............................................... H01B 07/00
(52) U.S. Cl. ............................... 174/110 R; 174/117 F; 174/117 FF
(58) Field of Search ........................ 174/110 R, 110 SR, 174/113 R, 117 R, 117 F, 117 FF, 120 R; 156/47, 55, 73.1, 580.1, 580.2

(56) References Cited

U.S. PATENT DOCUMENTS

| | | | |
|---|---|---|---|
| 4,878,969 A | 11/1989 | Janisch | |
| 5,250,127 A | 10/1993 | Hara | |
| 6,026,563 A | * 2/2000 | Schilson | |
| 6,156,138 A | 12/2000 | Suzuki et al. | |
| 6,222,131 B1 | * 4/2001 | Schilson | |

FOREIGN PATENT DOCUMENTS

| GB | 2121594 | | 12/1993 | |
|---|---|---|---|---|
| JP | 08-315644 | * | 11/1996 | ............ H01B/7/08 |
| JP | 09-185912 | * | 7/1997 | ............ H01B/7/08 |
| JP | 09-245541 | * | 9/1997 | ............ H01B/13/00 |
| JP | 2000-030552 | * | 1/2000 | ............ H01B/13/00 |
| JP | 0-502833 | | 3/2000 | |
| JP | 2002-109978 | * | 4/2002 | ............ H01B/13/00 |

* cited by examiner

Primary Examiner—William H. Mayo, III
(74) Attorney, Agent, or Firm—Greenblum & Bernstein, P.L.C.

(57) ABSTRACT

A flat cable includes first and second insulator sheets, and a plurality of conductor elements arranged in parallel relation to one another over the length of the sheets. The first insulator sheet is provided with an adhesive layer. The conductor elements are interposed between the adhesive layer and the second insulator sheet. The first and second insulator sheets are first press-adhered under heat through the adhesive layer, and then bonded by an ultrasonic welding unit. The ultrasonic welding unit includes a horn for imparting ultrasonic oscillations, and an anvil placed in opposition to the horn. The first and second insulator sheets are bonded in the zones which extend along the length of the sheets and are located outside the loci where the conductor elements are arranged. The bonding is performed either continuously or in an intermittent manner.

12 Claims, 12 Drawing Sheets

FLAT CABLE AND A MANUFACTURING METHOD THEREFOR

This is a division of U.S. patent application Ser. No. 09/901,112, filed Jul. 10, 2001 now U.S. Pat. No. 6,585,836, the contents of which are expressly incorporated by reference herein in its entirety

BACKGROUND OF THE INVENTION

1. Field of the Invention

The invention relates to a method of manufacturing a flat electrical cable used e.g. for wiring public utility apparatuses, office automation apparatuses, electronic parts mounted in vehicles, and the like. In particular, the invention concerns devices used for the manufacture of such a flat cable. The invention further concerns a flat cable produced by such a manufacturing method or device.

2. Description of Background Information

FIGS. 1A and 1B show how the prior art flat cables were manufactured in the past. According to a known method, a pair of insulator films 100 is prepared, so that each includes a base film 101 and an adhesive layer 102, the adhesive layers facing each other. A plurality of rectangular conductors 103 are then arranged parallel to one another, and are flanked by the pair of insulator sheets 100 over their length. Subsequently, the insulator sheets 100 are thermally bonded e.g. by heated rollers.

In the above manufacturing method, the adhesive layers 102 of the insulator sheets 100 have to be sufficiently thick for each of the rectangular conductors 103 to be deeply embedded in the adhesive layers 102, with the insulator sheets 100 firmly adhered and bonded. To obtain such a result, the base film 101 and adhesive layer 102 of each insulator sheet 100 must usually have an approximate thickness of 50 $\mu$m and 60 $\mu$m, respectively.

In such a construction, because the adhesive layers 102 must have substantial thickness, material costs are relatively high. In addition, as the adhesive layers 102 usually employ combustible agents, a flat cable including such a thick adhesive layer 102 raises the problem of inflammability.

Another flat cable manufacturing method is disclosed in Japanese Patent Application published under No.2000-502 833, according to which the rectangular conductors are initially arranged parallel to one another and sandwiched by two insulator sheets containing no adhesive layer, the insulator sheets being bonded to each other by ultrasonic welding.

However, ultrasonic welding alone does not allow the insulator sheets to be sufficiently well bonded, especially in the longitudinal zones extending between the rectangular conductors contained in the flat cable. When the insulator sheets are only loosely adhered, they may form air gaps therebetween, into which water or moisture from condensation may penetrate. Such a phenomenon creates a high risk of short-circuiting between the rectangular conductors.

In parallel, research is currently underway for a flat cable which requires a smaller space and weighs less. In this case too, the flat cable is manufactured by providing two insulator sheets, and interposing therebetween a number of mutually parallel rectangular conductor elements over the length of the sheets. According to one of the manufacturing methods, the insulator sheets flanking the conductor elements are bonded by ultrasonic welding.

According to one of the known ultrasonic welding methods, the side edges of insulator sheets which are positioned outside the parallel array of conductor elements are bonded intermittently by ultrasonic welding along the length direction of the sheets. However, in such a flat cable, electrically conductive material such as water tends to penetrate through non-bonded portions, thereby causing short circuits between the conductor elements.

The present invention aims at solving the problem caused by such an accident-prone flat cable, and provides a method for its manufacture, according to which the insulator sheets are intimately and firmly adhered through an adhesive layer, and, moreover, in which the adhesive layer can be made as thin as possible.

The invention also aims to provide a system for producing a flat cable, in which newly conceived ultrasonic welding units are used.

Further, the invention aims at manufacturing a flat cable, in which the conductor elements are efficiently prevented from short-circuiting.

SUMMARY OF THE INVENTION

To this end, there is provided a method of manufacturing a flat cable having a length and a width, the flat cable including first and second insulator sheets, and at least one adhesive layer interposed therebetween. The flat cable further includes a plurality of conductor elements arranged in parallel relation to one another over the length of the first and second insulator sheets. The method includes providing the adhesive layer on at least the first insulator sheet so as to face the second insulator sheet, interposing the conductor elements between the adhesive layer and the second insulator sheets, provisionally adhering the first and second insulator sheets including the conductor elements through the adhesive layer by means of heat pressing force exerted from outside the first and second insulator sheets, and bonding, by ultrasonic welding, the first and second insulator sheets through the zones extending along the length thereof and located outside the loci where the conductor elements are arranged.

Preferably, the adhesive-layer providing includes providing a first insulator sheet having a thickness of about 12 to about 300 $\mu$m and an adhesive layer having a thickness of about 1 to about 3 $\mu$m.

Preferably yet, the adhesive-layer providing includes providing an adhesive layer formed of the same type of material as that of the first insulator sheet, the adhesive layer containing no halogen-based flame-retardant.

Typically, the adhesive-layer providing includes providing the first and the second insulator sheets, so that one of them is at least about 1.5 times thicker than the other.

The invention also proposes a system for manufacturing a flat cable having a length and a width, the flat cable including first and second insulator sheets, and at least one adhesive layer interposed therebetween. The flat cable further includes a plurality of conductor elements arranged in parallel relation to one another over the length of the first and second insulator sheets. The system includes, along a production flow line from upstream to downstream, an adhesive application unit that provides the adhesive layer on at least the first insulator sheet so as to face the second insulator sheet, a conductor feed unit that interposes the conductor elements between the adhesive layer and the second insulator sheets, a provisional adhering unit that provisionally adheres the first and second insulator sheets including the conductor elements through the adhesive layer by a heat pressing force exerted from outside the first and second insulator sheets, and an ultrasonic welding unit that bonds the first and second insulator sheets through the zones extending along the length thereof and located outside the loci where the conductor elements are arranged.

Preferably, the above ultrasonic welding unit includes a horn that imparts ultrasonic oscillations, and an anvil located in opposition to the horn. The horn includes an oscillation-imparting portion, with which one of the first and second insulator sheets is placed into contact, and the anvil has a generally cylindrical form and includes an axis arranged perpendicularly to the production flow line, the anvil and being freely rotatable around the axis. The generally cylindrical body includes an outer cylindrical face including an appropriate number of arrays of protrusions, the protrusions being aligned in the circumferential direction of the outer cylindrical face and extending at a given interval therealong, such that the arrays of aligned protrusions can be placed into contact with the other of the first and second insulator sheets at both sides of each of the conductor elements. Preferably yet, the ultrasonic welding unit includes a horn that imparts ultrasonic oscillations, and an anvil located in opposition to the horn. The horn includes a plane, with which one of the first and second insulator sheets is placed into contact over the width hereof. The anvil has a generally cylindrical form that can rotate freely around an axis, the axis being provided perpendicular to the production flow line, and the anvil includes an outer circular face including an appropriate number of circular ribs continuously extending in the circumferential direction thereof, such that the circular ribs can be placed into contact with the other of the first and second insulator sheets at both sides of each of the conductor elements.

Each of the circular ribs may have an alternating broad and narrow width.

Typically, the ultrasonic welding unit includes first and second horns that impart ultrasonic oscillations, located respectively upstream and downstream on the production flow line at a given distance, and further includes corresponding first and second anvils located in opposition to the first and second horns. The first and second horns respectively include an oscillation-imparting generally cylindrical body, the generally cylindrical body having an axis arranged perpendicularly to the production flow line and being freely rotatable around the axis. Each of the oscillation-imparting cylindrical bodies has an outer cylindrical face including an appropriate number of arrays of protrusions aligned in the circumferential direction thereof and extending at a given interval therealong, such that the arrays of protrusions can be placed into contact with one of the first and second insulator sheets at both sides of each of the conductor elements. The first and second anvils are fixedly positioned and respectively include a plane, with which the other of the first and second insulator sheets is placed into contact, so that the first horn and anvil can form, by ultrasonic welding, a first series of intermittent bonded portions with a given interval therebetween, and the second horn and anvil then form a second series of bonded portions in the given interval.

Alternatively, the ultrasonic welding unit may include a horn that imparts ultrasonic oscillations, and an anvil located in opposition to the horn, the horn and anvil including respective planes opposing each other. The opposing planes of the horn and anvil include, respectively, an appropriate number of arrays, respectively formed of protrusions and recesses, each of the protrusions having the same gauge as each of the recesses along the length of the first and second insulator sheets, such that the arrays of the opposing face of the horn and those of the anvil can be placed into contact respectively with the first and second insulator sheets at both sides of each of the conductor elements. Thus, the first and second insulator sheets can be flanked by the arrays formed of protrusions and recesses of the horn and of the anvil, and subjected to a first ultrasonic welding, thereby forming intermittent first bonded portions, and the first and second insulator sheets can be moved by a distance equivalent to the gauge, and the first and second insulator sheets can be further subjected to a second ultrasonic welding, thereby forming second bonded portions that link the first bonded portions.

Alternatively yet, the ultrasonic welding unit may include a horn that imparts ultrasonic oscillations, and an anvil located in opposition to said horn. One of the horn and the anvil has a plane with a length which extends along the length of the first and second insulator sheets, while the other includes a cylindrical body having an axis arranged perpendicularly to the production flow line and being freely rotatable around the axis, the cylindrical body being movable back and forth along the production flow line. Additionally, the cylindrical body has an outer cylindrical face including an appropriate number of circular ribs extending in the circumferential direction of the outer cylindrical face, so that the circular ribs can be placed into contact with the first and second insulator sheets at both sides of each of the conductor elements.

As a variant, each of the circular ribs may have an alternating broad and narrow width, or each of the circular ribs may be provided with recesses.

A further object of the invention is to provide a flat cable including first and second insulator sheets having a length and a width, and containing a plurality of conductor elements arranged in parallel relation to one another over the length of the first and second insulator sheets. The flat cable further includes an adhesive layer which bonds the first insulator sheet, the second insulator sheet and the conductor elements interposed therebetween, by means of heat pressing.

In the above flat cable, the first and second insulator sheets are bonded at the zones extending along the length thereof and are located outside the loci where the conductor elements are arranged.

As a variant, each of the zones may be bonded in an intermittent way, or in a continuous way.

Preferably, the adhesive layer includes the same type of material as that of the first insulator sheet, the adhesive layer containing no halogen-based flame-retardant.

Typically, one of the first insulator sheet and the second insulator sheet is at least 1.5 times thicker than the other.

BRIEF DESCRIPTION OF THE DRAWINGS

The above and the other objects, features and advantages of the present invention will be made apparent from the following description of the preferred embodiments, given as non-limiting examples, with reference to the accompanying drawings, in which.

DETAILED DESCRIPTION OF THE PREFERRED EMBODIMENTS

Figure 2:
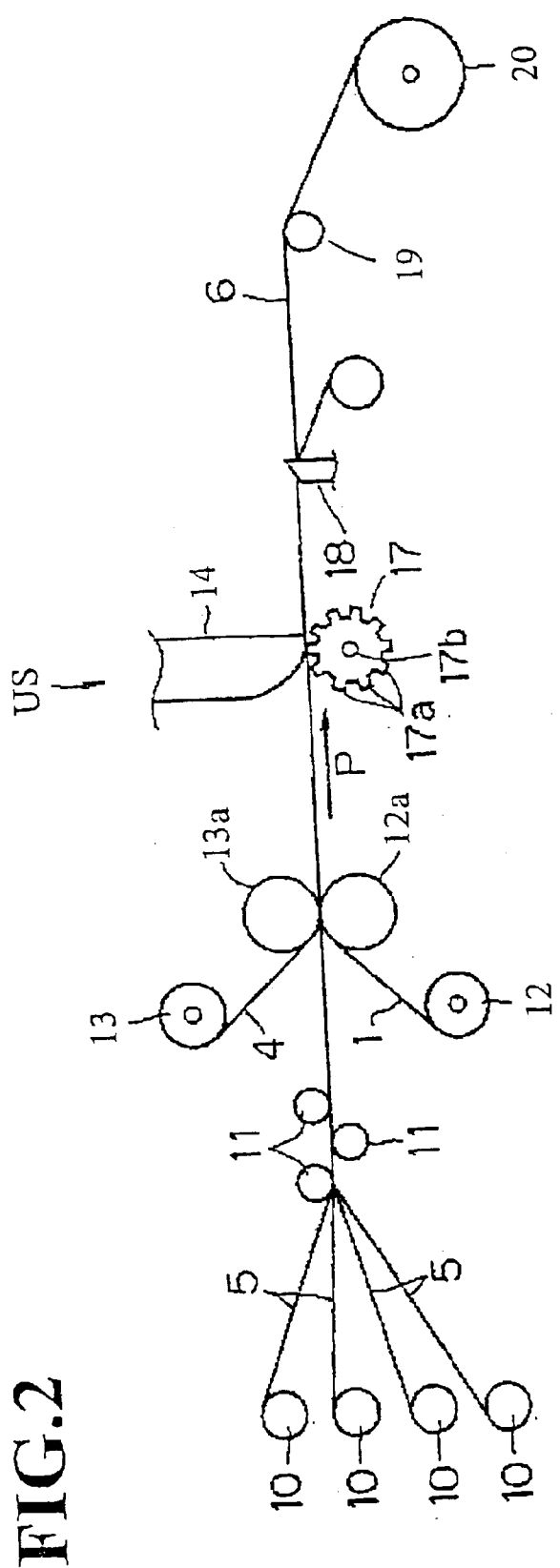
FIG. 2 is a schematic horizontal view of a production flow line for a flat cable according to the invention.

FIG. 2 shows a system for manufacturing a flat cable of the invention. The system includes several devices arranged along a production flow line P extending from an upstream side (left-hand side in FIG. 2) to a downstream side (right-hand side in FIG. 2). The production flow line P is provided, at the upstream side, with a conductor feed unit including a plurality of conductor feed rollers 10, from which are released the conductor elements 5 (e.g. conductor wires). The conductor feed rollers 10 are followed by pitch rollers 11 which dispose the conductor elements 5 at a given pitch, and further by a pair of sheet feed rollers 12 and 13, and heat press adhering units 12a and 13a, all of which are sequentially arranged along the production flow line P from upstream toward downstream.

Figure 3:
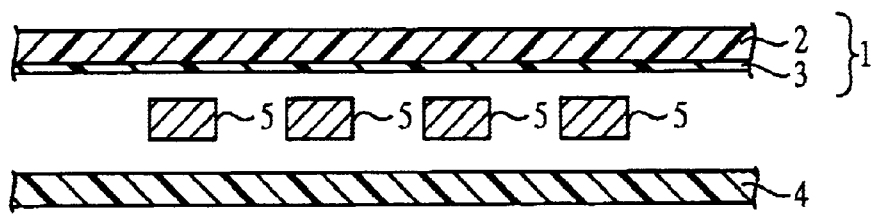
FIG. 3 is a cross-sectional view of the rectangular conductor elements and insulator sheets at a production stage of a flat cable according to the invention.

Each conductor feed roller 10 stores a coiled conductor wire 5 made, for example, of copper or a copper alloy. The conductor elements 5 are provided in a number corresponding to the number of the conductor elements 5 to be arranged in parallel to each other and embedded in a flat cable 6. In the present example, four conductor elements 5 are formed into a flat cable 6. Thus, there are provided four conductor feed rollers 10 in the production flow line P. Further, in this example, the conductor elements 5 used each have a rectangular cross-section, as shown in FIG. 3, although any suitable cross-section may be used.

The conductor elements 5 drawn on the corresponding conductor feed rollers 10 are aligned parallel to one another through the pitch rollers 11, and fed into the heat-press adhering units 12a and 13a.

The sheet feed rollers 12 and 13 are e.g. installed respectively below and above the production flow line P. First and second insulator sheets 1 and 4 have a band-like shape, and are coiled and stored around the respective sheet feed rollers 12 and 13.

In the present embodiment, only the first insulator sheet 1 is provided with an adhesive layer. The sheet is coiled around a first sheet feed roller 12 located below the production flow line P. Conversely, the second insulator sheet 4 includes no adhesive layer. The second sheet is coiled around a second sheet feed roller 13 located above the production flow line P (shown upside down in FIG. 2). The first insulator film 1 thus includes a base film 2 and an adhesive layer 3. The base film 2 is formed of a suitable flexible and ultrasonically fusible resin, e.g. polyethylene terephthalate (PET). One face thereof (the face to be adhered to the second insulator film 4) is provided with a thermoplastic (hot melt type) adhesive layer 3, by an adhesive application unit (not shown), e.g. by painting or spraying. The adhesive layer 3 is applied with any conventional adhesive application device known to those skilled in the art, and is not illustrated in the drawings. The second insulator sheet 4—which has no adhesive layer—just contains a base film formed of a flexible resin. Alternatively, an adhesive layer 3 may of course be provided on both insulator sheets 1 and 4, although their production costs become higher. The first insulator sheet 1 (with adhesive layer) and the second insulator sheet 4 (without adhesive layer) are then drawn out from the sheet feed rollers 12 and 13 respectively, and sent to the heat-press adhering units 12a and 13a.

The heat-press adhering units 12a and 13a form a provisional adhering unit and include a first heat adhesion roller 12a located below the production flow line P and a second heat adhesion roller 13a located above line P. The first and second insulator sheets 1 and 4 are superposed and introduced between the first and second heat press adhesion rollers 12a and 13a. The sheets 1 and 4 are thus heat adhered through the adhesive layer 3.

Figure 4:
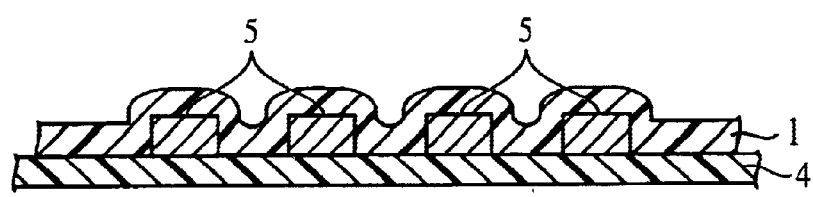
FIG. 4 is a cross-sectional view of the rectangular conductor elements and insulator sheets at a subsequent production stage.

As shown in FIG. 2, the second insulator sheet 4 coiled around the sheet feed roller 13 located above the production flow line P, is then superposed from above (shown upside down in FIG. 3) onto the conductor elements 5 aligned in parallel, while the first insulator sheet 1, which is wound around the sheet feed roller 12 located below the production flow line P, is superposed from below (shown upside down in FIG. 3) onto the same conductor elements 5. The insulator sheets 1 and 4 flanking the conductor elements 5 are then introduced between the first and second heat adhesion rollers 12a and 13a, and hot-pressed therebetween. As shown in FIG. 4, the insulator sheets 1 and 4 wrap the aligned conductor elements 5, and are provisionally heat-adhered to each other through the heat adhesion layer 3. At the same time, the insulator sheets 1 and 4 are firmly heat-adhered to the conductor elements 5 through the heat adhesion layer 3 (provisional adhesion).

The provisionally heat-adhered insulator sheets 1 and 4, which hold the conductor wires 5, are then sent to an ultrasonic bonding unit US.

Figure 5:
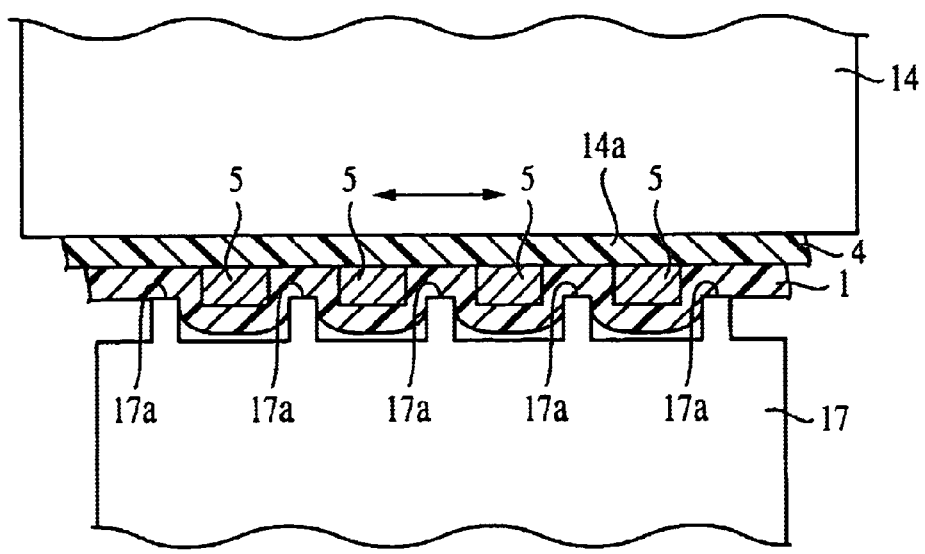
FIG. 5 is a cross-sectional view of the conductor elements and insulator sheets when they are bonded by ultrasonic welding.

As shown in FIGS. 2 and 5, the ultrasonic bonding unit US includes an oscillation-imparting horn 14 located above the production flow line P, and an ultrasonic anvil 17 located below the line P.

Figure 13:
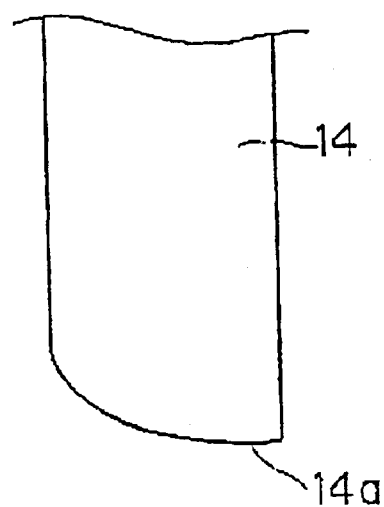
FIG. 13 is an enlarged view of a horn employed in the unit of FIG. 12.
Figure 14:
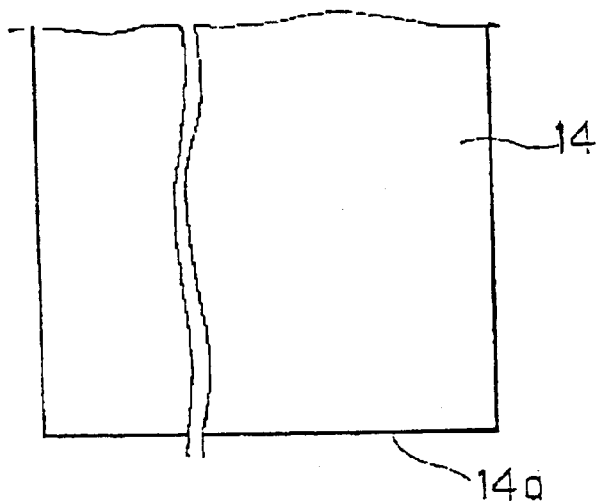
FIG. 14 is a left-hand side view of the horn of FIG. 13.

The oscillation-imparting horn 14 has an oscillation imparting portion 14a formed into a straight-line plane over the width of the second insulator sheet 4, the length of the plane being greater than the width of the sheet 4 (refer to FIGS. 13 and 14 infra). The oscillation-imparting portion 14a is provided perpendicularly to the upper face of the second insulator sheet 4, which moves along the production flow line P, such that it can rub along over the whole width of the second insulator sheet 4. The ultrasonic oscillations generated by a an ultrasonic oscillation-generating mechanism e.g. oscillator, are imparted to the oscillation-imparting horn 14. The latter 14 is configured so as to oscillate over the width of the second insulator sheet 4.

The ultrasonic anvil 17 has a generally cylindrical shape including an outer cylindrical face and an axis 17b. The outer cylindrical face is provided with several arrays of protrusions 17a aligned in the circumferential direction thereof, which are to be placed into contact with the first insulator sheet 1. Each array of protrusions is configured so as to surround the cylindrical face at a given pitch in the circumferential direction, defining a toothed wheel shape, such that the positions of those arrays of protrusions 17a correspond to the spaces between the parallel-aligned conductor elements 5, as well as to the two side edges of the first insulator sheet 1. The axis 17b of the ultrasonic anvil 17 is placed perpendicularly to the production flow line P, at a position therebelow. The ultrasonic anvil 17 is held around the axis 17b in a freely rotatable way. When the first insulator film 1 is advanced along the production flow line P, the arrays of protrusions 17a formed on the outer cylindrical face of the ultrasonic anvil are pressed onto the external face (bottom face) of the first insulator film 1. Accordingly, as the first insulator film 1 advances, the ultrasonic anvil rotates in synchronization with its advancement, by frictional dragging effect or by being driven by a rotation driver (not shown in figures).

Figure 6:
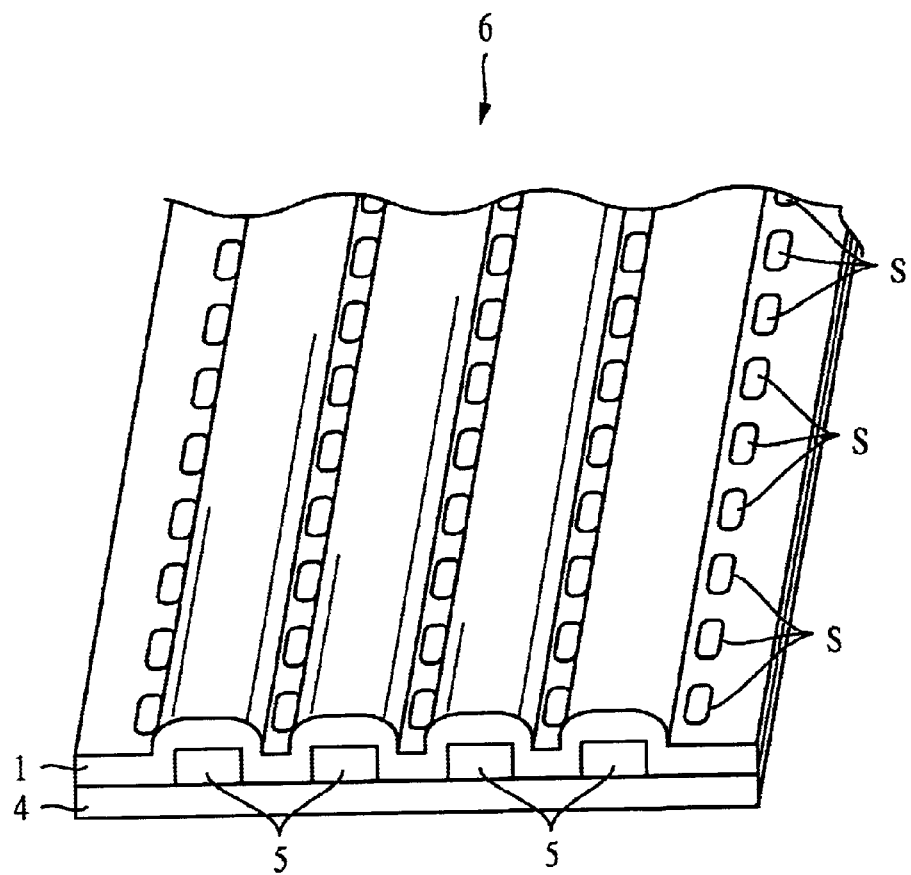
FIG. 6 is a perspective, partially cut-away view of the resultant flat cable.

When the insulator films 1 and 4 holding a plurality of conductor elements 5 are heat pressed and introduced between the oscillation-imparting horn 14 and the ultrasonic anvil 17, the oscillation-imparting portion 14a of the horn 14 rubs against the external face (top face) of the second insulator sheet 4 over the entire width thereof. At the same time, the arrays of protrusions 17a of the ultrasonic anvil 17 are placed under the oscillation-imparting portion 14a, and placed into contact with the external face of the first insulator sheet 1. The ultrasonic oscillation energy is imparted to the insulator sheets 1 and 4, while the latter are pressed against each other. As shown in FIG. 6, the insulator sheets 1 and 4 are bonded by ultrasonic welding in the zones extending circumferentially outside the parallel-aligned conductor elements 5. As the insulator sheets 1 and 4 move on, the oscillation-imparting portion 14a of the oscillation-imparting horn 14 rubs against the external face of the second insulator sheet 4, while the arrays of protrusions 17a of the ultrasonic anvil 17 are intermittently and sequentially placed into contact with the external face of the first insulator sheet 1. The insulator sheets 1 and 4 are thus bonded by ultrasonic welding through intermittent loci extending along the longitudinal direction of the insulator sheets 1 and 4 (ultrasonic welding).

Finally, the two side edges of the insulator sheets 1 and 4 are cut off by blades 18. The resulting flat cable 6 is then wound around a coiling roll 20.

According to the above production method, the conductor elements 5 are arranged parallel to one another, and interposed between the insulator sheets 1 and 4. The latter are first heat pressed against each other, and then bonded by ultrasonic welding to form a flat cable 6.

In the flat cable 6 thus produced, the insulator sheets 1 and 4 are bonded by ultrasonic welding in the zones outside the loci where the conductor elements 5 are arranged in parallel, so that the insulator sheets 1 and 4 can be bonded with a sufficient bonding force. Moreover, the bonding is effected by ultrasonic spot welding through loci S, so that, when the flat cable 6 is to be parted or peeled, the insulator sheets 1 and 4 can be easily separated from each other.

As the insulator sheets 1 and 4 are press-adhered under heat prior to ultrasonic welding, by heat adhesion rollers 12a and 13a, they can be bonded more snugly compared to a mere ultrasonic welding: both insulator sheets 1 and 4 are firmly and intimately adhered, avoiding the formation of air gaps. Moreover, as the insulator sheet 1 and the conductor elements 5 are adhered through the adhesive layer 3, these conductor elements 5 cannot be displaced easily from the positions where they are fixed by the insulator sheets 1 and 4.

Further, the ultrasonic welding produces a strong adhesive force between the insulator sheets 1 and 4. The adhesive layer 3 therefore only needs to be thick enough to secure the adhesion between the insulator sheets 1 and 4. The thickness of the adhesive layer 3 can thus be reduced to a minimum, compared to the prior art example shown in FIGS. 1A and 1B.

In practice, when the base film 2 of the insulator sheet 1 has a thickness of 12 to 300 $\mu$m, preferably 25 to 100 $\mu$m, the adhesive layer 3 may have a thickness of 1 to 3 $\mu$m.

As the adhesive layer 3 can be made thinner than in the prior art, use of inflammable adhesive agents can be reduced to a minimum, and the flat cable 6 thus manufactured procures a good flame resistance.

Figure 1A:
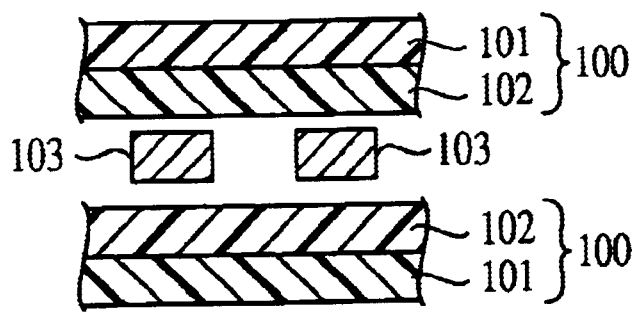
FIG. 1A is a cross-sectional view of rectangular conductor wires interposed between two insulator films in the prior art flat cable.
Figure 1B:
FIG. 1B is a cross-sectional view of the flat cable when the insulator films are adhered.
Figure 1B:
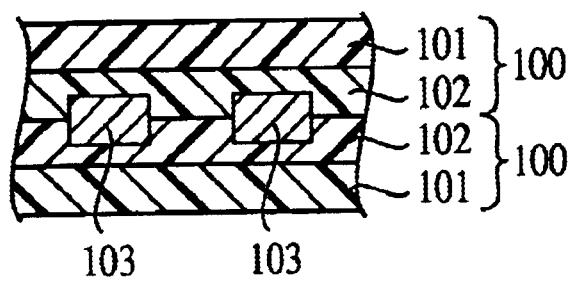

In the prior art example shown in FIGS. 1A and 1B, the adhesive layer contains a halogen-containing flame retardant in order to procure a sufficient resistance to flame. When such adhesive layers are scrapped, they generate halogen gas and raise environmental problems. By contrast, the present manufacturing method already confers to the flat cable 6 a good flame resistance, and allows using an adhesive agent containing no halogen compound. In addition, the inventive adhesive layer 3 can be made of an adhesive agent having the same type of material as that of the base film 2. Recycling processes of flat cables 6 can thus be greatly simplified. Examples of such an insulator sheet 1 include one in which the base film 2 is made of a polyester-type resin e.g. polyethylene terephthalate (PET) and polybutylene terephthalate (PBT), while the adhesive layer 3 is made of a polyester-type adhesive agent e.g. polyester elastomer. In another example, the base film 2 is formed of a polyolefin-type resin, e.g. polyethylene, while the adhesive layer 3 is formed of a polyolefin-type adhesive agent, e.g. ethylene-vinyl acetate polymer (EVA). In the above cases, the base film 2 and the adhesive layer 3 can be treated as similar material, and recycled and regenerated in a same handling way.

In variant embodiments described infra, the component elements corresponding to those already mentioned in the preceding embodiment are referred to with the same reference numbers. Only the new elements are explained specifically.

Figure 7:
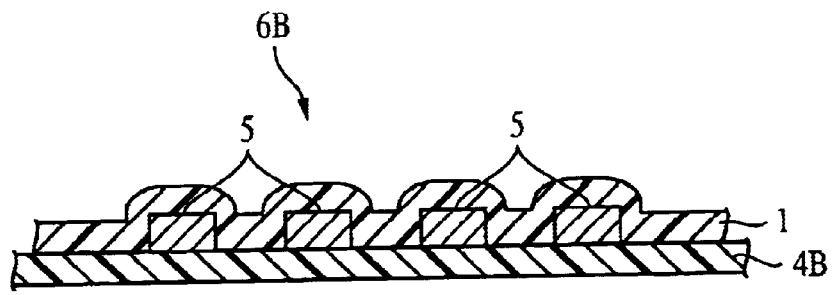
FIG. 7 is a cross-sectional view of a flat cable manufactured according to a first variant method.

In a first variant embodiment of a first aspect of the invention (FIG. 7), a transparent insulator sheet 4B containing no adhesive layer is used as the second insulator sheet 4, the transparent insulator film 4B being formed of a transparent resin such as polyethylene terephthalate (PET), 1-(N-phenylamino)naphthalene (PA), polycarbonate (PC), etc.

In the prior art case shown in FIGS. 1A and 1B, both insulator sheets 100 contain a respective adhesive layer 102. The insulator sheets 100 thus constructed tend to become opaque, typically because of the non-transparency of the adhesive layers 102. By comparison, the present invention enables use of the second insulator sheet 4 free of adhesive layer. Accordingly, this embodiment makes it much easier to create a transparent insulator sheet 4B merely by using a transparent resin and doing away with adhesive layer.

When the transparent insulator sheet 4B is used, the condition of the inner zone between the insulator sheets 1 and 4B can be observed directly from outside, through the transparent insulator sheet 4B. Undesirable inclusions, irregularities of the conductor elements and the like can thus be easily detected. Further, the front side and reverse side of the manufactured flat cable 6B can be easily recognized. As a result, for each flat cable 6B, the connecting points at both ends of each conductor element 5 can be observed very easily.

Figure 8:
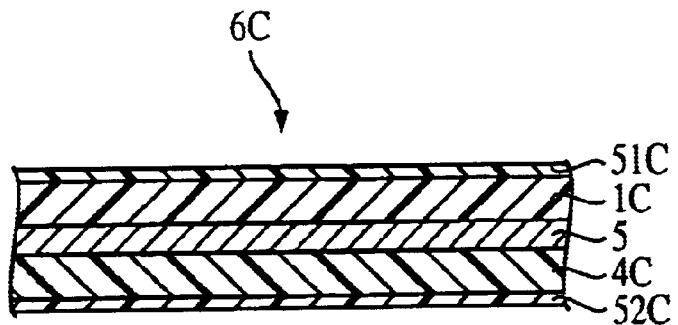
FIG. 8 is a cross-sectional view of a flat cable manufactured according to a second variant method.

In a second variant method (see FIG. 8), the first insulator sheet 1, including an adhesive layer in the above embodiments, is further coated with a thermoplastic adhesive layer over its external face (first external adhesive layer 51C), so as to form a first coated insulator sheet 1C. Typically, the second insulator sheet 4, which includes no adhesive layer in the preceding embodiments, is also coated with a thermoplastic adhesive layer over its external face (second external adhesive layer), so as to form a second coated insulator sheet 4C. When the heat-press adhesion is preformed, the adhesive layer 3 between the coated insulator sheets 1C and 4C is melted down and does not appear beside the conductor elements 5 (see FIG. 8).

When the flat cable 6C thus prepared is fitted into a counter-part fitting, e.g. a connector box in an apparatus, it can easily be fitted with the fitting through the external adhesive layers 51C and 52C.

In the preceding embodiment, when the coated insulator sheets 1C and 4C are thermally adhered, the external adhesive layers 51C and 52C may melt down together with the adhesive layer 3. Such a situation can be avoided by finishing the outer cylindrical face of the heat rollers 12a and 13a with e.g. a silicone resin, so that the surface become non-adhesive and the external adhesive layers 51C and 52C, even if melted, are not glued to the heat rollers 12a and 13a. In the same manner, the adhesive agent used for the external adhesive layers 51C and 52C may be chosen from among compounds having a melting point higher than that of the adhesive agent used in the adhesive layer 3 for bonding the insulator sheets 1C and 4C.

Figure 9:
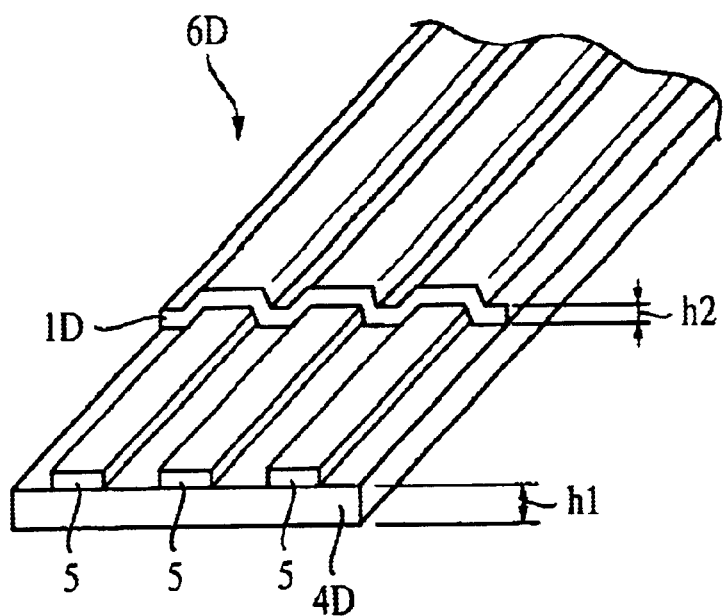
FIG. 9 is a perspective view of a flat cable manufactured according to a third variant method.

In a third variant shown in FIG. 9, the thickness h1 of the insulator sheet 4D, which corresponds to the insulator sheet 4 without adhesive layer in the first embodiment, may be set to be at least 1.5 times the thickness h2 of the base film of the insulator sheet 1D, which corresponds to the insulator sheet 1 with adhesive layer in the first embodiment. Alternatively, the thickness h2 may be at least 1.5 times the thickness h1.

In such a configuration, when the end portions of the finished flat cable 6D are made into terminals to be inserted into connectors, only the thinner insulator sheet, e.g. the first insulator sheet 1D, needs to be stripped off at the end portions, while the thicker insulator sheet 4D may be left as it stands. In such a case, the end portions of the flat cable 6D, though not reinforced by a supporting plate, may be made into terminals, the latter being sufficiently resistant to bending when inserted into connectors.

Figure 10:
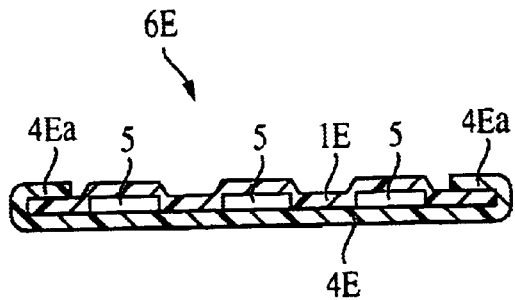
FIG. 10 is a cross-sectional view of a flat cable manufactured according to a fourth variant method.

In a fourth variant shown in FIG. 10, the width of the insulator sheet 4E, which corresponds to the insulator film 4 in the first embodiment, is set to be greater than that of the insulator sheet 1E, which corresponds to the insulator sheet 1 in the first embodiment. When both insulator sheets 1E and 4E are bonded, the two side edges 4Ea of insulator sheet 4E extend outwardly, are bent upwardly (when viewed in FIG. 10), and superposed over the corresponding two side edges of the insulator sheet 1E. The corresponding side edges are then bonded through, e.g. the thermoplastic adhesive agent, thereby forming a flat cable 6E.

In the above case, both side edges of the flat cable 6E form a smooth rounded edge, which has advantages of giving a soft touch feeling and also facilitates handling. Further, the side edges of the flat cable 6E are strengthened by the side edges 4Ea of the insulator sheet 4E, so that the flat cable 6E becomes more resistant to torsional stress. Furthermore, the end portions of the flat cable 6E will not be distorted when inserted into connectors.

Figure 11:
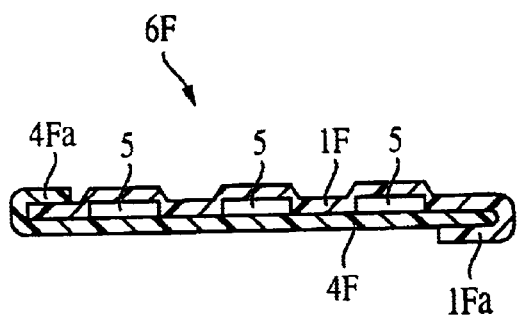
FIG. 11 is a cross-sectional view of a flat cable manufactured according to a fifth variant method.

In a flat cable 6F of a fifth variant (FIG. 11), insulator sheets 1F and 4F may be made slightly wider than the insulator sheets 1 and 4 of the first embodiment, and joined slightly biased to each other in their width direction. A side edge 1Fa of e.g. the insulator sheet 1F, which hangs over the corresponding side edge of the insulator sheet 4F, may then be bent downwardly (as viewed in FIG. 11) and superposed on the latter 4F. They may be then bonded by means of a thermoplastic adhesive agent. A side edge 4Fa of the insulator sheet 4F may be processed likewise, and adhered to the insulator sheet 1F.

Such a structure confers the flat cable 6F with the same effect as in the fourth variant case shown in FIG. 10. Moreover, as the insulator sheets 1F and 4F may have the same width, the number of component elements can be reduced, and manufacturing costs can be lowered.

A second aspect of the invention generally pertains to the ultrasonic welding unit employed in the production flow line P mentioned for the first aspect of the invention.

In the first aspect of the invention, the anvil used carries a plurality of arrays of protrusions aligned on its cylindrical face. By contrast, the anvil mentioned hereafter is designed to form a plurality of continuous circular ribs, while preserving the possibility of varying the width of the ribs along the circumferential direction.

Figure 12:
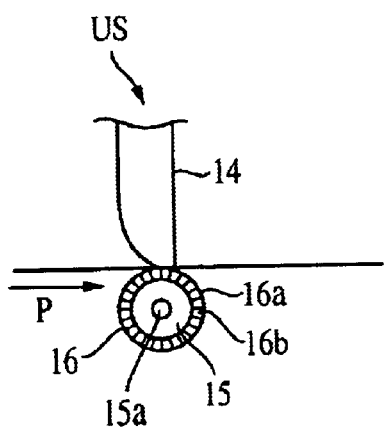
FIG. 12 is a side elevational view of an ultrasonic welding unit according to a first variant embodiment.
Figure 15:
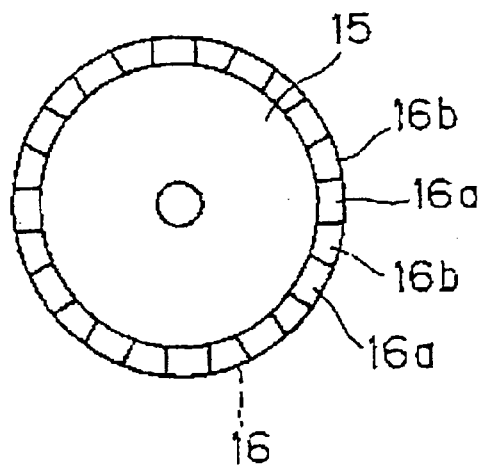
FIG. 15 is an enlarged elevational view of an anvil employed in the unit of FIG. 12.
Figure 16:
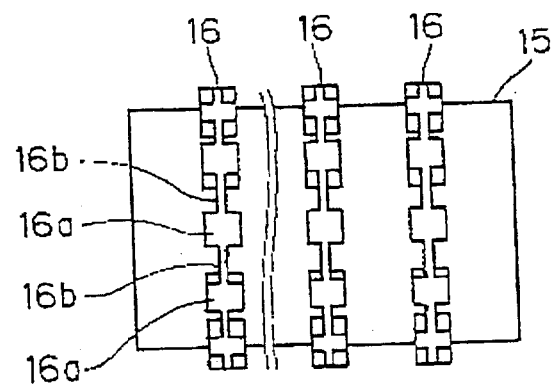
FIG. 16 is a left side view of the anvil of FIG. 15.

As shown in FIGS. 12 and 15, the anvil 15 of a first variant ultrasonic welding unit also has a generally cylindrical form, the axis 15a of which is spaced downwardly from the production flow line P, and positioned perpendicularly thereto. The anvil 15 is freely rotatable around the cylinder axis 15a. The outer cylindrical face of the anvil 15 carries several circular ribs 16, each of which extends along the circumferential direction, while alternating the size of the rib width. To this end, each circular rib 16 is provided with an alternating wide rib portion 16a and narrow rib portion 16b, at a given pitch along the circular direction. Further, the circular ribs 16 are arranged widthwise, so that they are positioned between the conductor elements on the one hand, and at the two side edges of the sheets on the other, when these sheets are passed through.

When the insulator sheets 1 and 4 are advanced along the production flow line P, the circular ribs 16 are placed into contact with the insulator sheet 1 located below the production flow line P. The anvil 15 is thus rotated through dragging, or can be rotated by a driving device (not shown in the figures) in synchronization with the supply speed of the insulator sheets 1.

Figure 17:
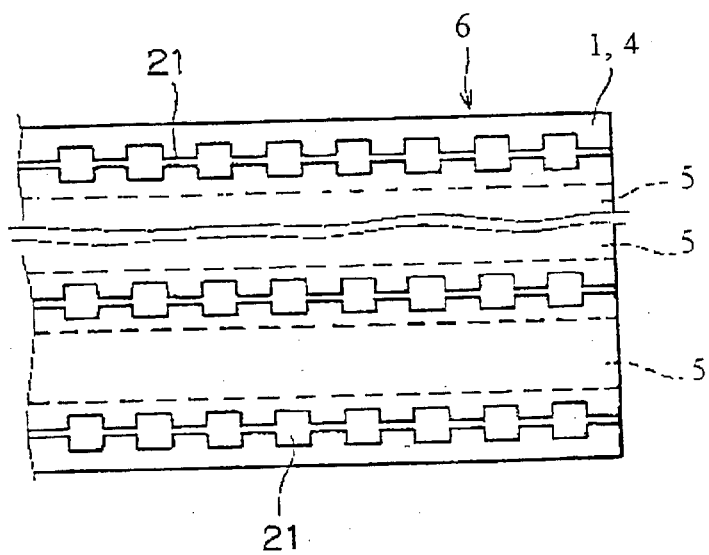
FIG. 17 is a top plan unit view of a flat cable produced by the first variant ultrasonic welding unit.

The insulator sheets 1 and 4 including the conductor elements 5 are thus sent between the horn 14 and the anvil 15, while the horn 14 is imparted with ultrasonic oscillations. Accordingly, the oscillation-imparting portion 14a of the horn 14 (shown in FIGS. 13 and 14) rubs against over the whole width of the insulator sheet 4 located above the production flow line P, while the circular ribs 16 of the anvil 15 are positioned right beneath the oscillation-imparting portion 14a and placed into contact with the insulator sheet 1 located below the production flow line P. In this condition, the circular ribs 16 are placed outside the zones where the conductor elements 5 are arranged in the flat cable. Thereafter, the insulator sheets 1 and 4 are first adhered under pressure. Ultrasonic oscillation energy is then imparted to the insulator sheets 1 and 4, and the latter are bonded through welding (FIG. 17).

As the insulator sheets 1 and 4 move on, the oscillation-imparting portion 14a of the horn 14 rubs along the outer face of the insulator sheet 4 located above the production flow line P. Simultaneously, the circular ribs 16 of the anvil 15 are placed into contact with the outer face of the insulator sheet 1 located below the production flow line P. The insulator sheets 1 and 4 are thus continuously bonded by ultrasonic welding along the length direction of the sheets 1 and 4.

A flat cable 6 thus formed by welding is sent to a guide roller 19, and wound around a coiling roll 20.

According to the above method including stepwise manufacturing, the insulator sheets 1 and 4 of the flat cable 6 are continuously welded at both sides of each conductor element 5 along the length direction of the sheets 1 and 4. An additional advantage of the first variant embodiment is that, even when electro-conductive contaminants e.g. water enter into the flat cable 6, each conductor element is efficiently prevented from short-circuiting with another conductor element 1 by intercalating continuous weld-bonding.

As shown in FIG. 17, the ultrasonically welded zone 21 includes wide welded portions and narrow welded portions. The insulator sheets 1 and 4 are thus bonded firmly adhered to each other, while preserving the feature that these sheets 1 and 4 can be easily detached at their end portions. This is a noteworthy advantage compared to a structure in which the welded zone has a wide welded portion all along the sheet length.

Figure 18:
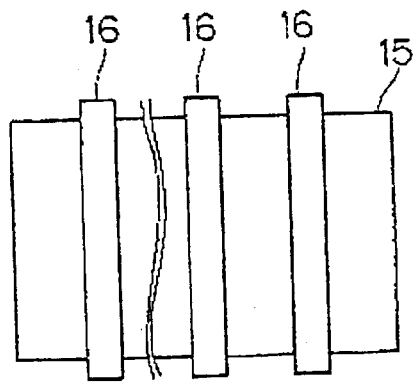
FIG. 18 is a side elevational view of the anvil contained in an ultrasonic welding unit according to a second variant embodiment.

By comparison, FIG. 18 shows a second variant ultrasonic welding unit, in which the circular ribs 16 of the anvil 15 are provided with the same width all along the circumferential direction of the ribs 16. The other constructional elements are the same as in the first variant embodiment.

Figure 19:
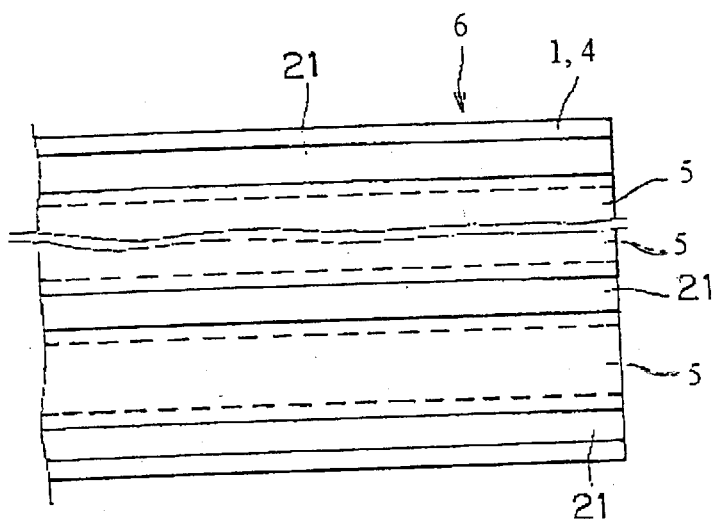
FIG. 19 is a top plan view of a flat cable produced by the second ultrasonic welding unit.

As shown in FIG. 19, the flat cable 6 according to the second variant means includes a welded zone 21 having the same width over the length direction of the flat cable 6. As in the first variant, even when water or other electro-conductive contaminants enter into the flat cable 6, each conductor element is efficiently prevented from short-circuiting with another conductor element 1 by intercalating continuously welded bonds.

Figure 20:
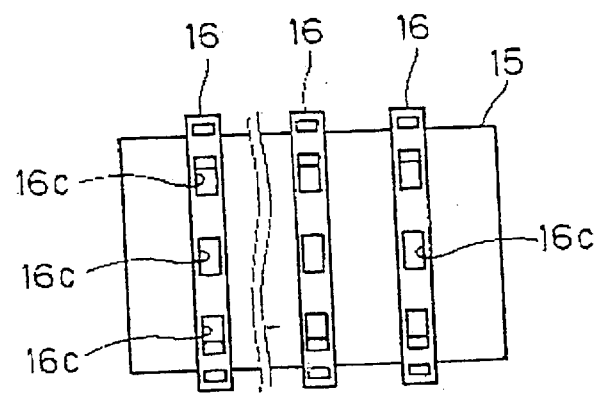
FIG. 20 is a side elevational view of the anvil contained in an ultrasonic welding unit according to a third embodiment.

FIG. 20 shows a third variant ultrasonic welding unit, in which the circular ribs 16 of the anvil 15 have the same width along the circumferential direction of the ribs 16, as in the second variant. However, the circular ribs 16 are provided with recesses 16c at a given pitch along the circumferential direction. The pitch between the recesses 16c may be chosen as a function of a balance desired to be established between the adhesion strength and the peeling facility. The other construction components are the same as in the first variant means.

The flat cable 6 produced in the third variant means includes welded zones 21 having varying welded surfaces along their length, and produces the same effect as in the first variant.

Figure 21:
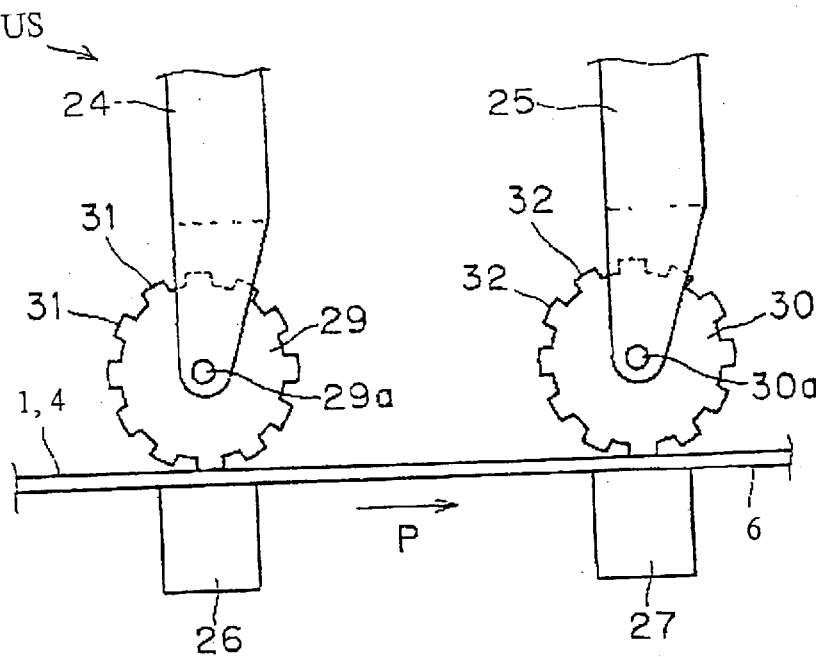
FIG. 21 is an elevational view of an ultrasonic welding unit according to a fourth embodiment.

FIG. 21 shows a fourth variant ultrasonic welding unit of the invention, in which the same construction components are referred to with the same references as in the first variant of the invention.

In this embodiment, the ultrasonic welding unit US includes an upstream horn 24 and a downstream horn 25 (located at a given distance downstream along the production flow line P), respectively imparting ultrasonic oscillations to the insulator sheets 1 and 4. The ultrasonic welding unit US further includes a corresponding upstream anvil 26 and downstream anvil 27.

The upstream anvil 26 and the downstream anvil 27 are fixedly installed, and include respectively a plane top face which is placed into contact with the insulator sheet 1 located below the production flow line P.

The upstream horn 24 and the downstream horn 25 include corresponding oscillation-imparting bodies 29 and 30 having a cylindrical form, the axes 29a and 30a of which are spaced upwardly from the production flow line P and placed perpendicularly thereto.

Figure 22:
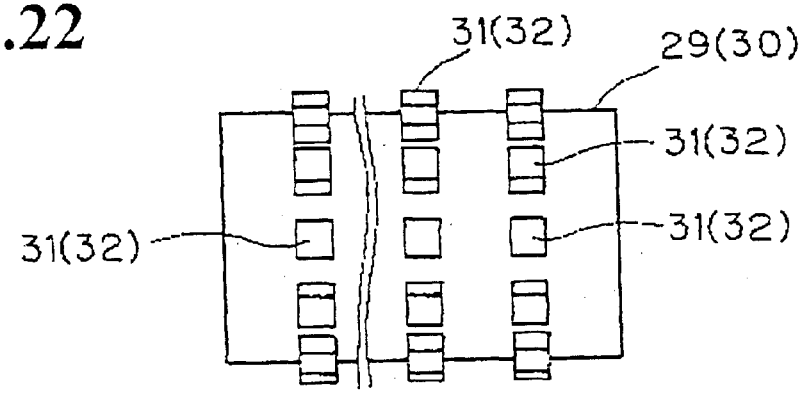
FIG. 22 is a left side view of an oscillation-imparting body of the ultrasonic welding unit of FIG. 21.

As shown in FIG. 22, the outer circular faces of the oscillation-imparting bodies 29 and 30 are provided with circumferentially aligned protrusions 31 and 32, which extend around the oscillation-imparting body 29 or 30 at a given pitch. These circumferentially-aligned protrusions 31 and 32 are arranged such that, when they are placed into contact with the insulator sheet 4, they are positioned at opposite sides of each conductor element 5.

Figure 23:
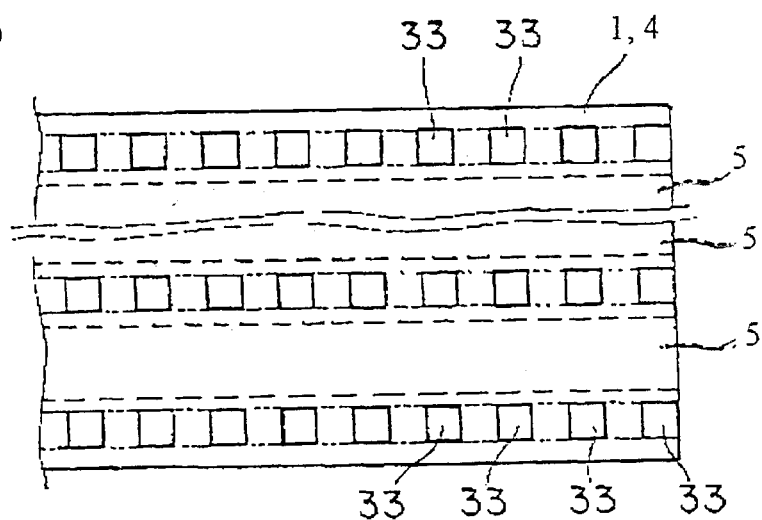
FIG. 23 is a top plan see-through view of a flat cable partially bonded by the ultrasonic welding unit of FIG. 21.
Figure 24:
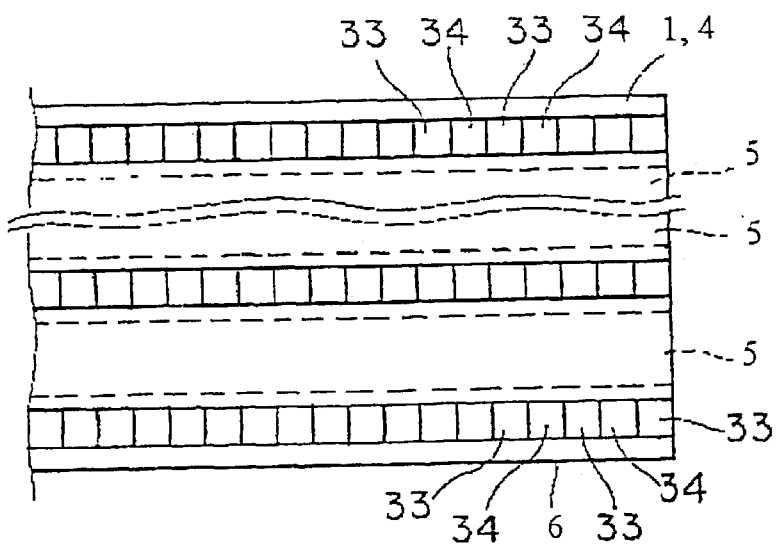
FIG. 24 is a top plan view of a flat cable produced by the ultrasonic welding unit of FIG. 21.

As shown in FIG. 23, the upstream horn 24 and upstream anvil 26 form, between the insulator sheets 1 and 4, the first welded portions 33 which extend along the length direction of the sheets 1 and 4 at a given pitch. The spaces between the first welded portions 33 are then filled with second welded portions 34 by means of the downstream horn 25 and downstream anvil 27, as shown in FIG. 24.

According to the above method and device, the zones of insulator sheets 1 and 4 which flank each conductor element 5 are sequentially welded first by the upstream horn 24 and anvil 26, then by the downstream horn 25 and anvil 27. The respective welded portions 33 and 34 form continuous welded zones along the length direction of the sheets 1 and 4. Such a construction has the advantage of protecting the flat cable 6 from water or other contaminant penetration, and the conductor elements 5 from short-circuiting. Further, the above method and device allow formation of a circular rib which has alternating broad and narrow rib widths, in a very simple way.

More particularly, when the protrusions 31 of a first oscillation-imparting body 29 have a wider size, while the protrusions 32 of a second oscillation-imparting body 30 have a narrower size, the obtained insulator sheets 1 and 4 obtain a good adhesive force between the sheets 1 and 4, while enabling an easy peeling-off at the end portions of the sheets 4, as in the case of the first variant.

Figure 25:
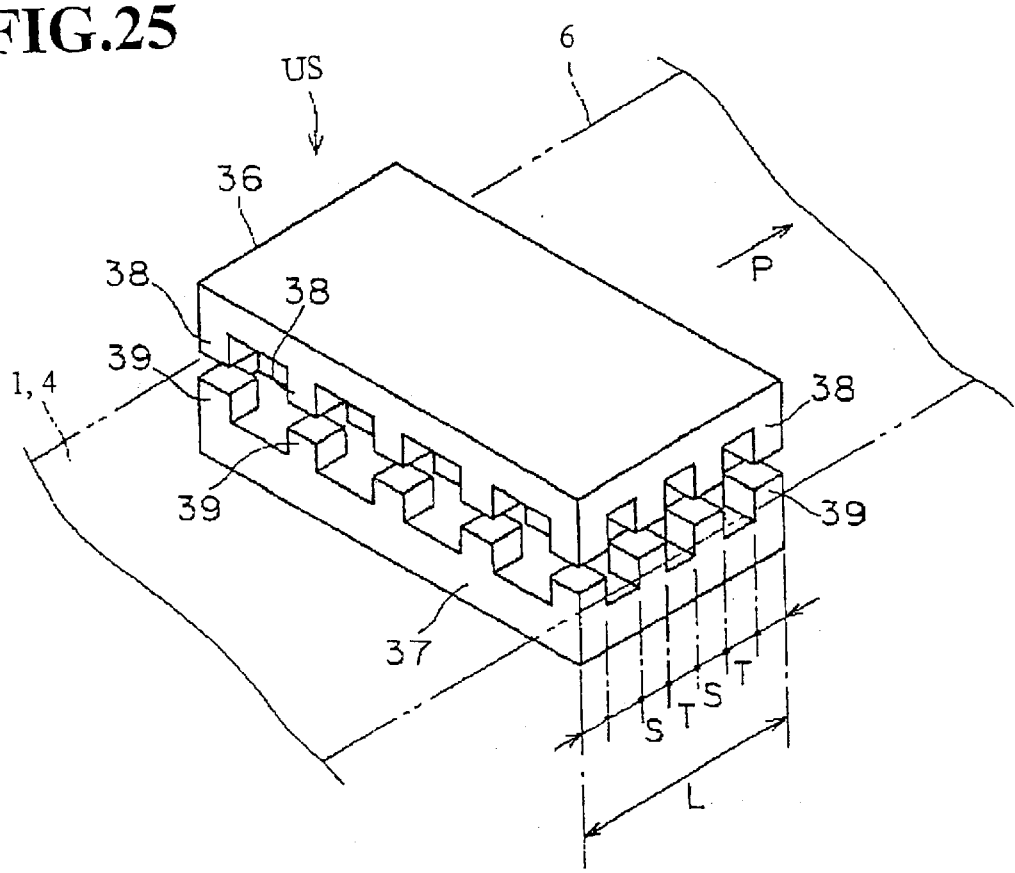
FIG. 25 is a perspective view of an ultrasonic welding unit according to a fifth embodiment.

FIG. 25 shows a fifth variant embodiment of the ultrasonic welding unit US, in which the same construction components as in the first variant are referred to with the same numbers.

In this embodiment, the horn 36 and anvil 37 constituting an ultrasonic welding unit US are respectively provided with rectangular blocks 38 and 39 on their opposing inner faces. The rectangular blocks 38 and 39 are placed into contact with the corresponding insulator sheets 1 and 4 at opposite sides of each conductor element 5. Each rectangular block 38 or 39 has a side line placed in parallel relation to the production flow line P, the side line having a size S. Likewise, the space between two rectangular blocks has a corresponding side line having a size T.

A rectangular block 38 of the horn 36 and the corresponding rectangular block 39 of the anvil 37 flank the two insulator sheets 1 and 4 and bond them by ultrasonic welding, so as to form intermittent first welded portions 33 as shown in FIG. 23. The insulator sheets 1 and 4 are then advanced by the distance T. Subsequently, the rectangular blocks 38 and 39 flank the insulator sheets 1 and 4 and bond them by ultrasonic welding, so that the troughs in the blocks formed by preceding welding are fully or partially filled with second welded portion 34. When size S is equal to size T, the welded portions form a continuous welded line.

The insulator sheets 1 and 4 are then moved by distance L, which corresponds to the side length of the horn 36 and anvil 37 along the production flow line P, and the same operation is repeated.

More particularly, the insulator sheets 1 and 4 are first ultrasonically welded by the rectangular blocks 38 and 39 of the corresponding horn 36 and anvil 37 at both sides of each conductor element 5 embedded in the flat cable 6. The insulator sheets 1 and 4 are then moved by distance T and further welded by the same method. The first and second welded portions 33 and 34 thus formed make a continuous welded zone. Such a continuous welded zone can efficiently protect the flat cable 6 from water or other conductor contaminants and the conductor elements 5 from short-circuiting, as mentioned already.

FIGS. 26 to 29 show a sixth variant embodiment of the ultrasonic welding unit US, in which the same construction components as in the first variant embodiment are referred to with the same reference numbers.

In this embodiment, the upper face of the anvil 41 in the ultrasonic welding unit US forms a plane having a given side length along the production flow line P. On the other hand, the horn 42 used is the same as the one shown for the fourth variant. Namely, the horn 42 includes an oscillation-imparting body 43 having a cylindrical form. It is supported by an axis located perpendicular to the production flow line P, in a freely rotatable way. The horn 42 together with the oscillation-imparting body 43 can be freely moved back and forth along the production flow line P.

The outer circular face of the oscillation-imparting body 43 is constructed so as to form the anvil 15 in the first variant ultrasonic welding means. Namely, it is provided with protrusions 16 aligned in the circumferential direction. These protrusions 16 are adapted to be placed into contact with the second (top-side) insulator sheet 4, on opposite sides of each conductor element 5.

Figure 26:
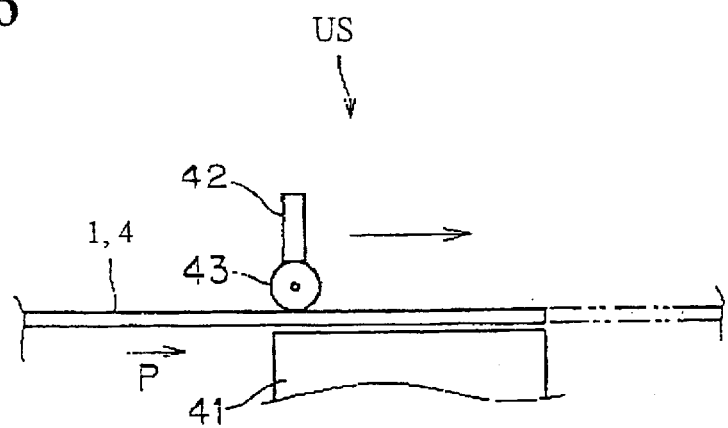
FIGS. 26 to 29 are the views of sequential operational steps, in which a horn and an anvil are handled according to a variant embodiment.

As shown in FIG. 26, the horn 42 is placed over the anvil 41 at its upstream side on the production flow line P. The horn 42 is then moved downstream where the insulator sheets 1 and 4 are not yet welded.

Figure 27:
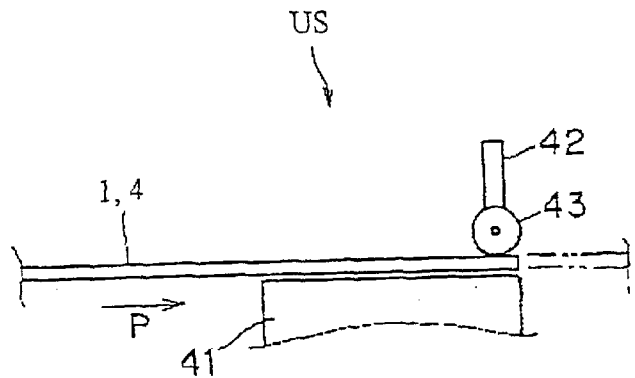

As shown in FIG. 27, the horn 42 is moved up to the downstream end of the anvil 41, the insulator sheets 1 and 4 being ultrasonically welded along the way.

Figure 28:
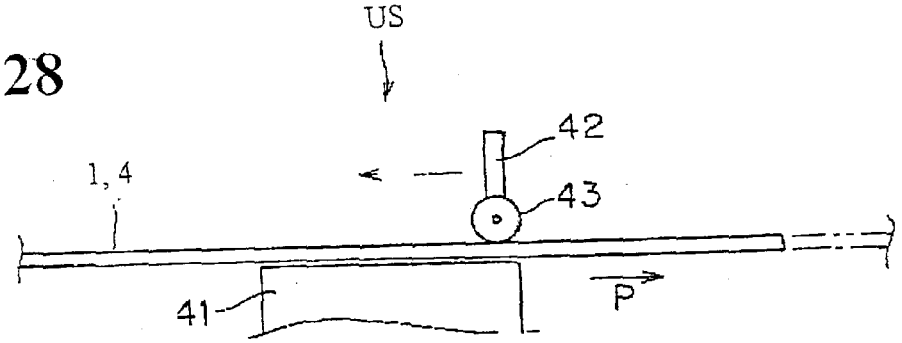

As shown in FIG. 28, the insulator sheets 1 and 4 are moved by a predetermined distance along the production flow line P, while the horn 42 is slightly raised. In this manner, the advancing edge of the insulator sheets 1 and 4 to be subsequently welded is positioned at the downstream end of the anvil 41.

Figure 29:
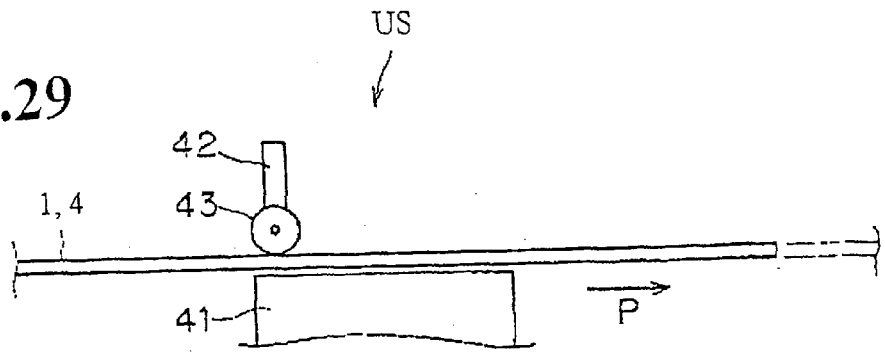

As illustrated in FIG. 29, the horn 42 is then moved back to the upstream side of the anvil 41, while the insulator sheets 1 and 4 are ultrasonically welded by the horn 42 and anvil 41.

By repeating the above procedure, the insulator sheets 1 and 4 are ultrasonically welded through a batch process, by the unit of a predetermined fraction.

According to the present embodiment, the welded portion of the flat cable 6 forms a continuous zone along the length direction of the flat cable 6. Such a structure has the same advantage as mentioned for the second variant.

Moreover, the outer cylindrical face of the oscillation-imparting body 43 may be provided with the aligned protrusions 16 with the widths of the ribs varied, as in the first variant embodiment. The insulator sheets 1 and 4 then obtains a good mechanical strength, while preserving a balanced peeling facility at the sheet end portions.

Alternatively, the outer cylindrical face of the oscillation-imparting body 43 may also be configured as that of the second and third variant of the invention.

In the above sixth ultrasonic welding unit, the horn 42 is designed as a mobile unit. However, the configuration of the horn 42 and that of the anvil 41 may be reversed in the above construction. Namely, the horn 42 may be configured so as to have a given length along the production flow line P, while the anvil 41 may be configured like the anvil 15 in the first, second and third variants, which moves freely back and forth along the production flow line P.

In each of the above embodiments, four conductor elements 5 are embedded in a flat cable. However, the number of conductor elements is not specifically limited, and may be five or any other appropriate numbers.

As can be understood from the inventive method described above (first aspect of the invention), a pair of insulator sheets is provisionally adhered by a hot-press procedure, and then bonded by ultrasonic welding. As a result, the insulator sheets can be bonded very firmly and intimately, even if the adhesive layer applied is very thin.

When manufacturing an insulator sheet coated with an adhesive layer by applying the above method, the base film (one constituent of the above sheet) may be about 12 to about 300 $\mu$m thick, while the adhesive layer (another constituent) may be as thin as about 1 to about 3 $\mu$m.

As the adhesive layer is so thin, its material may be the same as that for the base film, and need not include any halogen-containing retardant. The resultant flat cable is thus flame resistant, easily recyclable and generates no halogen gas upon burning.

Further, the thickness of one of the two insulator sheets (measured for the base film, as the case may be) may be at least 1.5 times that of the other sheet. The end portions of the manufactured flat cable may then be made into terminals which are to be inserted into connectors. To do this, only the thinner insulator sheet is stripped off, preserving the thicker insulator sheet as it is. The terminals thus prepared can be inserted easily into the connectors without being distorted.

The ultrasonic welding unit includes a horn which imparts ultrasonic oscillations, and an anvil arranged in opposition to the horn. The horn has a contact plane that extends over the width of the insulator sheets and is placed into contact with one of the insulator sheets. The anvil has a cylindrical form that can freely rotate around an axis. This axis is arranged in a direction perpendicular to the direction of motion of the insulator sheets. The outer circular face of the anvil may include an appropriate number of arrays of continuous circular ribs or aligned protrusions arranged in the circumferential direction of the anvil, so that each circular rib or each group of aligned protrusions can be placed into contact with the insulator sheets on opposite sides of each conductor element.

In another ultrasonic welding unit, an upstream horn and a downstream horn may be provided at a given distance along the direction of motion of the insulator sheets, the horns imparting ultrasonic oscillations, while the corresponding upstream and downstream anvils are likewise provided. The upstream and downstream anvils include a contact plane with which is placed into contact one of the insulator sheets. In the this case, the anvils are fixedly installed. The upstream and downstream horns respectively include a oscillation-imparting body having a cylindrical form, the axis of which is placed perpendicularly to the moving direction of the insulator sheets. The oscillation-imparting bodies are held around the corresponding axes in a freely rotatable way. The outer circular face of the oscillation-imparting bodies may include an appropriate number of groups of protrusions aligned at a given interval in the circumferential direction of the cylindrical body, so that each group of aligned protrusions can be placed into contact with the insulator sheets at both sides of each conductor element. The upstream horn and-anvil first form intermittent first welded portions, with a recess between the two welded portions. The downstream horn and anvil then form second welded portions filling those recesses.

In another ultrasonic welding unit, the opposing faces of the horn and anvil respectively include an appropriate number of groups of aligned protrusions which are arranged so as to be placed into contact with the insulator sheets at opposite sides of each conductor element. The group of aligned protrusions is formed along the direction of motion with an interval which is the same as the moving pitch of the insulator sheets. The groups of aligned protrusions of the horn and anvil flank the insulator sheets and form intermittent first welded portions on the latter by ultrasonic welding. The insulator sheets are then moved by the above-mentioned pitch, and the intervals between the first welded portions are bonded in the same manner.

In yet another ultrasonic welding unit, one of the horn and the anvil is formed into a plane having a length along the direction of motion of the insulator sheets. The other includes a cylindrical body having an axis arranged perpendicularly to the direction of motion of the insulator sheets, such that the cylindrical body can rotate freely around this axis. The cylindrical body can further move back and forth along the direction of motion of the insulator sheets. The outer circular face of the cylindrical body includes an appropriate number of continuous circular ribs which can be placed into contact with the insulator sheets at both sides of each conductor element.

A third aspect of the invention concerns the flat cables prepared according to the methods and by the devices described above.

In the flat cable thus prepared, at least one of the insulator sheets (first insulator sheet) includes an adhesive layer at its inside face which faces the other insulator sheet (second insulator sheet). A plurality of conductor elements are then arranged substantially parallel to one another, and interposed between the adhesive layer and the second insulator sheet. The insulator sheets are subsequently pressed against each other under heat, and bonded by ultrasonic welding. By virtue of this stepwise procedure, the insulator sheets are firmly bonded, although the adhesive layer is made as thin as possible.

As the adhesive layer is made very thin, it can be made of the same type of material as the base film which contains no halogen-type retardant. The flat cable made thereof thus has a good flame resistance, is easily recyclable, and forms no halogen gas when burned.

When one of the insulator sheets has a thickness greater than 1.5 times that of the other insulator film (measured for the base film, as the case may be), the end portions of the flat cable can be very easily made into terminals (which are to be inserted into connectors). Namely, the thinner insulator sheet is stripped off from the end portions of the flat cable, while the thicker insulator sheet is kept as it is. The terminals thus prepared can be inserted easily into the connectors, without being distorted.

In the flat cable thus prepared, both sides of each conductor element are closed by the welded zones. Therefore, even if water or other conductor contaminants enter the flat cable, each conductor element is prevented from short-circuiting with other conductor elements.

Although the invention has been described with reference to particular means, materials and embodiments, it is to be understood that the invention is not limited to the particulars disclosed and extends to all equivalents within the scope of the claims.

The present disclosure relates to subject matter contained in priority Japanese Application Nos. 2000-209759 and 2000-244711, respectively filed on Jul. 11 and Aug. 11, 2000, the disclosures of which are both herein expressly incorporated by reference in their entireties.

What is claimed:

1. A flat cable comprising first and second insulator sheets having a length and a width, and containing a plurality of conductor elements arranged in parallel relation to one another over the length of said first and second insulator sheets;

said flat cable further comprising an adhesive layer which bonds said first insulator sheet, said second insulator sheet and said conductor elements interposed therebetween by heat-pressing;

said first and second insulator sheets being bonded in the zones extending along said length thereof and located outside the loci where said conductor elements are arranged;

wherein one of said first insulator sheet and said second insulator sheet is at least 1.5 times thicker than the other.

2. The flat cable according to claim 1, wherein each of said zones is bonded in an intermittent manner.

3. The flat cable according to claim 1, wherein each of said zones is bonded in a continuous manner.

4. The flat cable according to claim 1, wherein said adhesive layer comprises material the same as material of said first insulator sheet, said adhesive layer containing no halogen-based flame-retardant.

5. A flat cable comprising first and second insulator sheets having a length and a width, and containing a plurality of conductor elements arranged in parallel relation to one another over the length of said first and second insulator sheets;

said flat cable further comprising an adhesive layer which bonds said first insulator sheet, said second insulator sheet and said conductor elements interposed therebetween by heat-pressing;

said first and second insulator sheets being bonded in the zones extending along said length thereof and located outside the loci where said conductor elements are arranged;

wherein one of said first and second insulator sheets is wider than the other of said first and second insulator sheets, wherein lateral edge portions of the one of said first and second insulator sheets being folded over and bonded to lateral edge portions of the other of said first and second insulator sheets;

wherein one of said first insulator sheet and said second insulator sheet is at least 1.5 times thicker than the other.

6. The flat cable according to claim 5, wherein each of said zones is bonded in an intermittent manner.

7. The flat cable according to claim 5, wherein each of said zones is bonded in a continuous manner.

8. The flat cable according to claim 5, wherein said adhesive layer comprises material the same as material of said first insulator sheet, said adhesive layer containing no halogen-based flame-retardant.

9. A flat cable comprising first and second insulator sheets having a length and a width, and containing a plurality of conductor elements arranged in parallel relation to one another over the length of said first and second insulator sheets;

said flat cable further comprising an adhesive layer which bonds said first insulator sheet, said second insulator sheet and said conductor elements interposed therebetween by heat-pressing;

said first and second insulator sheets being bonded in the zones extending along said length thereof and located outside the loci where said conductor elements are arranged;

wherein said first and second insulator sheets are partially offset from one another in a lateral direction, each of said first and second insulator sheets having a lateral edge portion folded over and bonded to a lateral edge portion of the other of said first and second insulator sheets;

wherein one of said first insulator sheet and said second insulator sheet is at least 1.5 times thicker than the other.

10. The flat cable according to claim 9, wherein each of said zones is bonded in an intermittent manner.

11. The flat cable according to claim 9, wherein each of said zones is bonded in a continuous manner.

12. The flat cable according to claim 9, wherein said adhesive layer comprises material the same as material of said first insulator sheet, said adhesive layer containing no halogen-based flame-retardant.

* * * * *